(12) United States Patent
Heuer et al.

(10) Patent No.: US 7,330,854 B2
(45) Date of Patent: Feb. 12, 2008

(54) GENERATING A BIT STREAM FROM AN INDEXING TREE

(75) Inventors: Jörg Heuer, München (DE); Andreas Hutter, München (DE); Andrea Kofler-Vogt, Kolbermoor (DE); Harald Kosch, Klagenfurt (AT)

(73) Assignee: Siemens Aktiengesellschaft, Munich (DE)

( * ) Notice: Subject to any disclaimer, the term of this patent is extended or adjusted under 35 U.S.C. 154(b) by 250 days.

(21) Appl. No.: 10/535,166

(22) PCT Filed: Oct. 30, 2003

(86) PCT No.: PCT/EP03/12098

§ 371 (c)(1),
(2), (4) Date: May 16, 2005

(87) PCT Pub. No.: WO2004/047304

PCT Pub. Date: Jun. 3, 2004

(65) Prior Publication Data

US 2006/0064424 A1 Mar. 23, 2006

(30) Foreign Application Priority Data

Nov. 15, 2002 (DE) .................. 102 53 275
Aug. 18, 2003 (DE) .................. 103 37 825

(51) Int. Cl.
*G06F 7/00* (2006.01)
*G06F 17/00* (2006.01)
(52) U.S. Cl. ..................... 707/102; 707/100
(58) Field of Classification Search ............. 704/200, 704/200.1; 706/15; 707/102
See application file for complete search history.

(56) References Cited

U.S. PATENT DOCUMENTS

| 5,153,591 | A | * | 10/1992 | Clark ..................... 341/51 |
| 5,509,088 | A | * | 4/1996 | Robson ................. 382/233 |
| 5,557,786 | A | * | 9/1996 | Johnson, Jr. ........... 707/101 |
| 5,794,249 | A | * | 8/1998 | Orsolini et al. ....... 707/104.1 |
| 6,354,126 | B1 | * | 3/2002 | Small et al. ............. 72/162 |
| 6,721,723 | B1 | * | 4/2004 | Gibson et al. ............ 707/2 |

(Continued)

OTHER PUBLICATIONS

XP-000628870—Lams et al., "Representing Lexicons by Modified Trie for Fast Partial String Matching", Character Recognition Technologies, San Jose, Feb. 1-2, 1993, pp. 229-237.
XP-010526449—Wong et al., "An XML repository for molecular sequence data", Proceedings IEEE International Symposium on Bio-Informatics and Biomedical Engineering, Nov. 8, 2000 pp. 35-42.

(Continued)

*Primary Examiner*—Jean M Corrielus
*Assistant Examiner*—Christopher P Nofal
(74) *Attorney, Agent, or Firm*—Bell, Boyd & Lloyd LLP

(57) ABSTRACT

A method is disclosed for creating a bit stream from an indexing tree including a plurality of hierarchical levels, to each of which one or several index nodes are assigned. The index nodes contain index data which is sorted in the indexing tree according to one or several given criteria. Index data of the index nodes is inserted into the bit stream, and the information concerning the position within the bit stream, where the index data of one or several index nodes of the hierarchical level located below the hierarchical level of the respective node is situated, is inserted into the bit stream for an index node.

13 Claims, 4 Drawing Sheets

U.S. PATENT DOCUMENTS

| | | | | |
|---|---|---|---|---|
| 7,020,643 B2* | 3/2006 | Mah et al. | ............... | 706/46 |
| 7,133,877 B2* | 11/2006 | Peckham | ............... | 707/102 |
| 7,171,407 B2* | 1/2007 | Barton et al. | ............... | 707/4 |
| 2003/0028557 A1* | 2/2003 | Walker et al. | ............... | 707/500 |
| 2003/0177341 A1* | 9/2003 | Devillers | ............... | 712/227 |
| 2004/0010752 A1* | 1/2004 | Chan et al. | ............... | 715/513 |
| 2004/0032422 A1* | 2/2004 | Fisher et al. | ............... | 345/716 |
| 2004/0133848 A1* | 7/2004 | Hunt et al. | ............... | 715/500 |
| 2006/0253448 A1* | 11/2006 | Tagashira et al. | ............... | 707/9 |
| 2007/0156750 A1* | 7/2007 | Calahan | ............... | 707/102 |

OTHER PUBLICATIONS

XP-001001465, "Text of ISD/IEC FCD 15938-1 Information Technology—Multimedia Content Description Interface—Part 1 Systems" ISO/IEC JTCI/SC29/WG11 MPEG01/N4001, Mar. 2001, pp. 1-2, I-V, 6-58.

XP-010604420, Niedenneier et al., "An MPEG-7 tool for compression and streaming of XML data" Proceedings of IEEE International Conference on Multimedia and Expo (ICME) Bd. 1, Aug. 26, 2002 pp. 521-524.

* cited by examiner

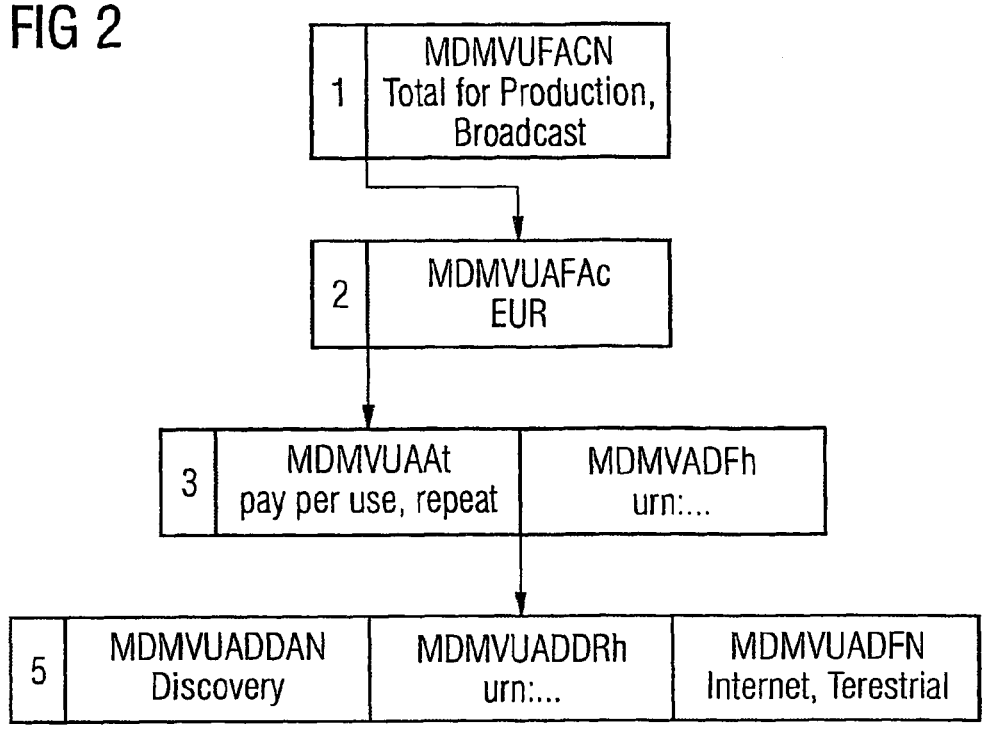

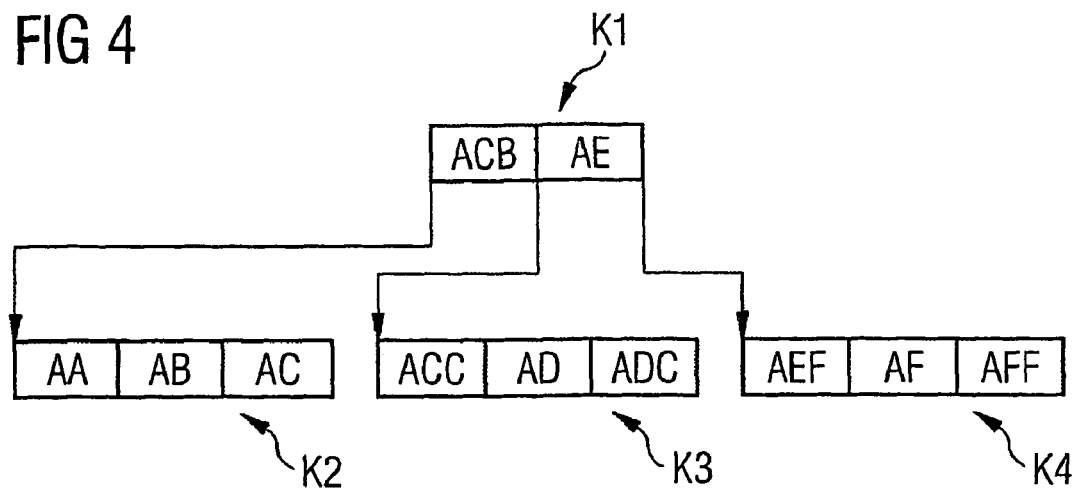
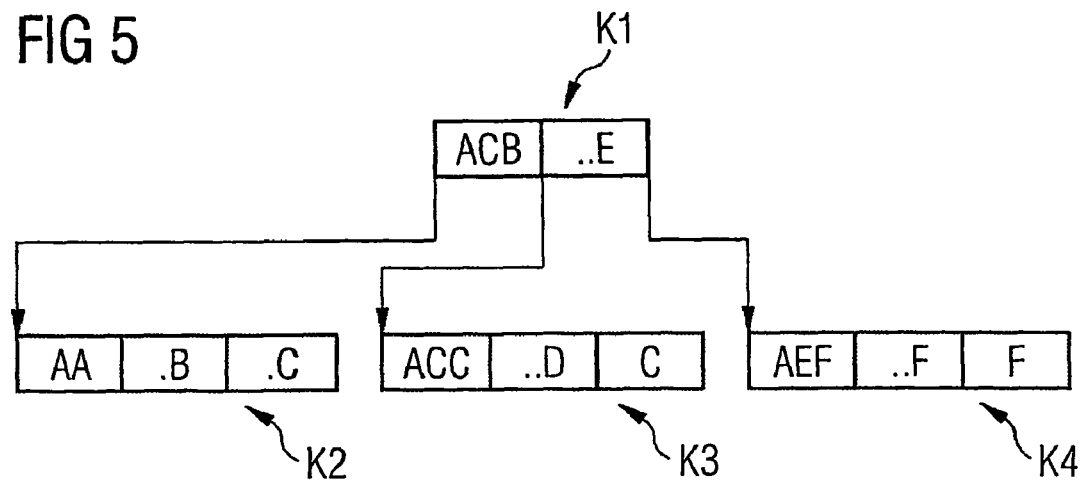

GENERATING A BIT STREAM FROM AN INDEXING TREE

FIELD OF TECHNOLOGY

The present disclosure relates to a method for generating a bit stream from an indexing tree as well as to a coding method and a decoding method which make use of the method for generating the bit stream. The invention further relates to a coding and decoding device.

BACKGROUND

It is often necessary to read out certain contents from a bit stream according to a query previously formulated by a user or to determine with regard to certain contents whether the contents are in fact contained in the bit stream at all. In this case, a query, defined by a user, can be formulated using a query language such as SQL (see reference [1]) or XPATH (see reference [2]). It is advantageous here if the entire bit stream does not have to be searched for the desired contents but instead if the information is stored in an indexing list or in an indexing tree, so that only that part of the bit stream in which the indexing tree or the indexing list is stored has to be searched.

One problem of reading out data from a bit stream arises in the case of a document produced with the aid of the XML language (XML=Extensible Markup Language) and represented in the MPEG7 BiM format. With regard to the MPEG7 BiM format of an XML document, reference is made to [3] ISO/IEC 15938-1 Multimedia Content Description Interface—Part 1: Systems, Geneva 2002. Under this configuration the generated bit stream is subdivided into a plurality of units (access units) which consist of a plurality of fragments (fragment update units). The units are coded and where necessary sent in the form of an MPEG7 BiM stream to one or more recipients.

With regard to the querying of information from XML documents, a multiplicity of query languages are already known which permit searches to be made in the document for specific information. Reference may be made at this juncture by way of example to the already mentioned query language XPATH (see reference [2]). The query language XPATH can be used to define selection criteria for filtering desired information within an XML document. In this case the purpose of a query can be to assess whether a unit of the bit stream is important for the recipient. Also a query can be used in a targeted manner to access specific desired information in the XML document. During the generation of the bit stream of an XML document the MPEG7 coding method has provided no mechanisms which enable random access to specific elements of the XML document. The MPEG7 bit stream must therefore be decoded for the purpose of searching for elements. A document in XML format is then obtained once again, which document can be searched by means of the query language XPATH. The decoding and subsequent processing of an XML document in order to search for specific contents is therefore very time-consuming, and thus unacceptable for certain time-critical applications. Furthermore the problem can arise that the memory in the decoder is limited, with the result that the bit stream cannot be fully decoded. In addition, the overhead involved in decoding was unnecessary if the XPATH query executed on the decoded XML document ends with a negative result.

Within the framework of TV-Anytime (TVA), which is described in [4] TV-Anytime Specification Series S-3 on Metadata, Part B, Version 13, an index structure is used which permits random access to certain elements of a data fragment. The index structure consists of a plurality of parts and comprises what is referred to as a "key index list" in which all indexed paths of a document are stored. When a query is submitted, those paths are compared in turn with the query until a matching entry is found in the key index list. Based on the information that is stored in the key index list in relation to this entry, the positions in a description stream at which the indexed entry is present in coded form can be determined. As a result of using the key index list it is no longer necessary to decode irrelevant data fragments, so that less memory space is required during a query. However, the linear processing of the key index list is time-consuming and the transfer of all the indexed paths is laborious and resource-intensive.

The document Lam S. W. et al., "Representing lexicons by modified trie for fast partial string matching", Character Recognition Technologies, San Jose, 1-2 February 1993, Bellingham, SPIE, pages 229-237, describes a fast lexical search method wherein an input sequence can have both an indefinite length and also several non-specified letters.

The document Wong R. K. et al., "An XML repository for molecular sequence data", Proceedings IEEE International Symposium on Bio Informatics and Biomedical Engineering", pages 35-42, describes a method wherein a large set of data can be efficiently searched with the aid of a "skip tree".

BRIEF SUMMARY

Under an exemplary embodiment, a method is provided for generating a bit stream from an indexing tree wherein the search for indexed data is made easily and efficiently possible.

An indexing tree from which a bit stream is generated by means of the present method comprises a multiplicity of hierarchy levels, each hierarchy level being assigned one or more index nodes wherein the index nodes contain index data that is sorted in the indexing tree according to one or more predetermined criteria. Under this method, the index data of the index nodes is inserted into the bit stream and for each index node there is also inserted into the bit stream the information indicating at which position in the bit stream the index data of one or more index nodes of the hierarchy level, which lies below the hierarchy level of the respective node is located. As a result of storing the additional information relating to the index nodes in a lower hierarchy level a search for specific index data is considerably simplified since by this means branches to the index nodes relevant to the search are made possible. Considerably more efficient queries and searches for index data are therefore guaranteed.

Under the exemplary embodiment the indexing tree is structured as what is referred to as a "B tree" (Balanced Tree) which ensures a balanced distribution of the data over the nodes of the tree. A detailed description of the B tree can be found in reference [5].

The index data in the indexing tree can be sorted according to any criteria, lexicographically for example.

Index data is inserted into the bit stream according to the depth-first ordering principle. Through the use of depth-first ordering the index data in the indexing tree is inserted into the bit stream initially according to depth, as a result of which the items of information relevant to a query are arranged adjacent to one another in the bit stream and information that is not relevant can be efficiently skipped. A detailed description of depth-first ordering can be found in reference [6].

In an alternate embodiment, the index data comprises paths of a document structure tree which has a root node and a plurality of leaf nodes. The index data preferably also comprises the value instances of the paths and the positions of the value instances in the document which is represented by the document structure tree. In addition, the index data also includes the number of paths in an index node.

In this case the paths can be absolute paths which start from the root node of the document structure tree and lead to a leaf node of the document structure tree. Under the embodiment, the paths are preferably relative paths, a relative path of where a respective index node being a path relative to a path, previously inserted into the bit stream, of the respective index node or of an index node of a hierarchy level above the hierarchy level of the respective index node. The use of relative paths enables commonalities in the paths to be used, for the paths of adjacent nodes usually have a common component. In this way, the amount of memory space required for storing the index data in the bit stream can be reduced. A further reduction of the memory space requirement can be achieved by inserting the paths of the index node whose index data is the first of a hierarchy level to be inserted into the bit stream in reverse sequence to the sequence in which the index data is arranged in the index node. This takes into account the fact that the index data at the end of the first index node of a hierarchy level has a greater similarity to the index node of the next-higher hierarchy level than the index data at the beginning of the first index node. Consequently a particularly effective coding results in certain cases through the use of relative paths.

The paths may also comprise description elements of an XML document (XML=Extensible Markup Language), where the paths being in particular XPATH paths of the XML document.

The index data may also be coded in binary format by means of a coding method, in particular by means of an MPEG coding method. Under an alternate embodiment, the MPEG7 coding method is used.

In addition to the above-described method for generating a bit stream the disclosure further comprises a method for coding a data structure wherein the data elements of the data structure are indexed in an indexing tree, with a bit stream being generated according to the inventive method and said bit stream being part of the coded data stream. The invention also comprises a method for decoding a data structure, the method being embodied in such a way that a data structure coded by means of the coding method just described is decoded.

The invention further comprises a method for coding and decoding a data structure which comprises the above-described coding and decoding method.

The invention also comprises a coding device by means of which the coding method according to the invention can be performed, as well as a decoding device by means of which the decoding method according to the invention can be performed. The invention further relates to a corresponding device for coding and decoding by means of which the above-described combined coding and decoding method can be performed.

BRIEF DESCRIPTION OF THE DRAWINGS

The various objects, advantages and novel features of the present disclosure will be more readily apprehended from the following Detailed Description when read in conjunction with the enclosed drawings, in which:

FIG. 2 illustrates a section from the indexing tree of FIG. 1;

FIG. 3 illustrates a section from a bit stream which has been generated from the indexing tree of FIG. 1 by means of a method under the exemplary embodiment;

FIG. 4 illustrates a simplified indexing tree in which the index data is ordered lexicographically and represents paths of a document structure tree;

FIG. 5 illustrates the indexing tree of FIG. 4, with some of the paths of the second hierarchy level being represented as relative paths;

DETAILED DESCRIPTION

Figure 1:
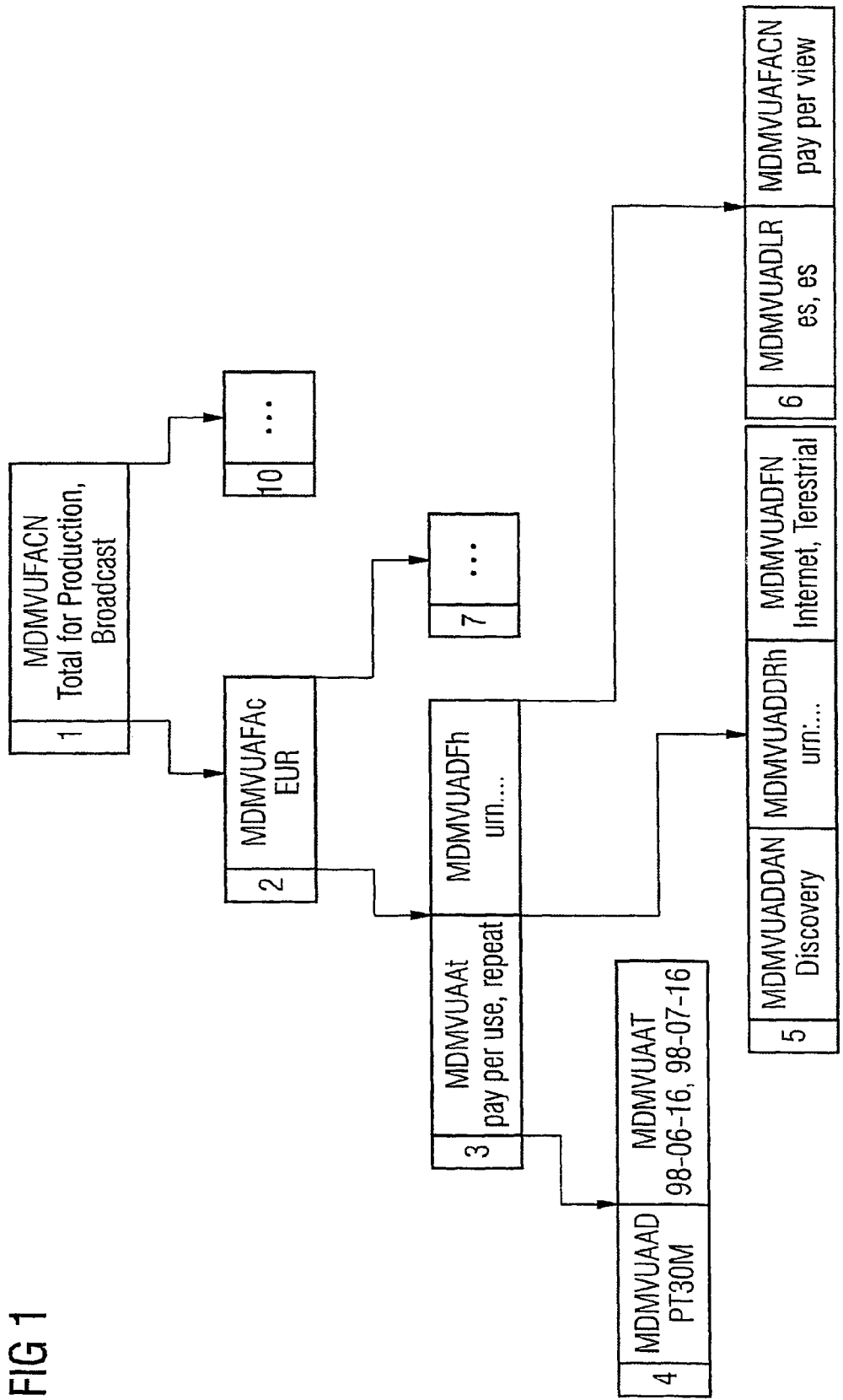
FIG. 1 illustrates an indexing tree used in the method under an exemplary embodiment.

FIG. 1 shows an example of an indexing tree used in the method according to the present disclosure. The tree is what is known as a B tree (where B stands for Balanced) which is often used for the indexing of data. The structure of a B tree is described for example in the already mentioned reference [5]. The B tree has a balanced structure and consequently permits searching with only a logarithmic overhead compared to the number of entries, whereas a linear overhead is required for searching by means of a list.

The indexing tree contains a plurality of nodes 1 to 10, with one or more items of index data being stored in each node in the form of what are referred to as keys. In the present case the items of index data are XPATH paths of a description tree of an XML document. A description of XPATH paths can be found in the already mentioned reference [2]. The XPATH paths lead from the root node of the description tree of the XML document to the individual leaf nodes of the description tree of the XML document. XML elements with simple content and all XML attributes are used as leaf nodes in the description tree used in this embodiment. Consequently, the index data of the indexing tree shown in FIG. 1 comprises root-leaf paths of an XML description tree.

In the indexing tree shown in FIG. 1, the XPATH paths are represented as a series of upper- and lowercase letters and are ordered lexicographically, with each letter standing for an element name in the XML description tree. For example, the path MDMVUFACN in node 1 means: MPEG7/Description/MultimediaContent/Video/UsageInformation/FinancialResults/AccountItem/Costtype/Name. Also stored in the nodes in addition to the path are the value instances in which this path occurs in the XML document. In the present case the path MDMVUFACN occurs twice in index node 1 with the instances "Total for Production" and "Broadcast". In contrast, the path MDMVUAFAc occurs only once in index node 2 with the instance "EUR".

The numbering of the index nodes in the indexing tree of FIG. 1 corresponds to the order in which the index data is inserted into the bit stream with the aid of the method according to the invention. In this case the order corresponds to what is known as a depth-first ordering scheme, as described for example in the already mentioned reference [6]. The insertion of the index data into the bit stream according to the depth-first ordering principle results in a lesser complexity during access to the index data, since information that is not relevant is skipped during the search for index data.

FIG. 2 shows a section from the indexing tree from FIG. 1 with the aid of which the querying of index data in this tree will be explained using an example. In this case the query is whether the XPATH path MPEG7/Description/Multimediacontent/Video/UsageInformation/Availability/Dissemination/Disseminator/Agent/Name contains the value instance "Discovery" (in short notation MDMVUADDAN="Discovery"). Since the search string MDMVUADDAN is lexicographically less than the XPATH path "MDMVUFACN" of index node 1, the search refers back to index node 2. The search string is in turn lexicographically less than the entry "MDMVUAFAc" of index node 2. For this reason a transition is made to index node 3 located to the left of index node 2. Said index node contains two XPATH paths "MDMVUAAt" and "MDMVUADFh". The search string lies between these two XPATH paths, so in the next hierarchy level a transition is made to index node 5 which lies between index node 4 and index node 6. This index node now contains as its first element the searched-for XPATH path "MDMVUADDAN" as well as the searched-for value instance "Discovery". Thus, the matching value instance was found in index node 5 and the position of the corresponding element in the indexed XML document is then obtained. As a result of the fact that the index nodes are inserted into the bit stream according to the depth-first ordering principle, all further nodes of the indexing tree are ignored or skipped during the search, so the search for elements in the indexing tree has reduced complexity.

The insertion of index data into the bit stream is described in greater detail below, with reference to FIG. 3, which shows a section from a bit stream generated using the presently disclosed method. In the bit stream shown in FIG. 3 the numbers of the index nodes are listed for the sake of clarity, although these numbers are not necessarily transmitted with the stream. The contents of index nodes 1 and 3 are shown in FIG. 3. As the first element the nodes initially contain the number of entries, that is to say the number of XPATH paths stored in the node. This results here in the number 1 for index node 1 and the number 2 for index node 3. Next, there follows the key for each entry, that is to say the respective XPATH path as well as the number of instantiations, i.e. the number of value instances that said XPATH path has in the XML document. For index node 1, for example, this results in the instantiation number 2 for the XPATH path "MDMVUAFCN", since the path having the two value instances "Total for Production" and "Broadcast" occurs in the XML document. Furthermore, for each value instance, the position of the value instance in the XML document is inserted into the bit stream. Also inserted into the bit stream, in addition to this information, is information concerning at which position in the bit stream—in particular at which position relative to the current position (offset)— the index data of index nodes of the next-lower hierarchy level that are connected to the respective index node is located. This enables nodes that are not relevant for a predetermined search query to be skipped.

The nodes branching from one node into a lower hierarchy level are referred to below as child nodes. It should be noted with the disclosed method that the information relating to the position of the first child node of a hierarchy level does not need to be stored since the child node is read in next in the bit stream. Thus, as can be seen from FIG. 3, only the position of index node 10 (referenced as "offset (10)") is stored for index node 1 and only the positions of the index nodes 5 and 6 (referenced as "offset (5)" and "offset (6)") are stored for index node 3. If it transpires, for example, that the searched-for information for a query is lexicographically greater than the XPATH in node 1, a branch is immediately made to node 10, so that it is no longer necessary to search index node 2 and the index nodes branching off from index node 2. By this means an effective search is made possible.

The following table lists once again which information is stored per node in the bit stream.

TABLE 1

Node {
    number of entries
    for each entry:
        Key
        number of instantiations
        for each instantiation:
            value instance
            Position
    for each child node except the first
        offset in the stream The bit stream generated by means of the method is transmitted to the recipient and can be read out in accordance with a query which was explained by way of example in relation to FIG. 2. By means of comparisons between the XPATH to be queried and the entries in the index node's specific node information is read out from the stream until the corresponding searched-for XPATH containing the searched-for value instance has been found or until no matching XPATH path is possible any longer on account of the sorting. In the latter case the desired information is not contained in the indexed document.

Further embodiments of the method according to the inventions are explained below with reference to FIGS. 4 to 7, which illustrate simplified indexing trees with lexicographically ordered entries. FIG. 4 shows an indexing tree which is to be coded and which comprises nodes K1 to K4. In this case, node K1 is referred to as a parent node and the nodes K2 to K4 branching off from node K1 are referred to as child nodes. The entries are paths of a document structure tree. Instead of transmitting the paths with their entire length in the bit stream it is possible to store what are known as relative paths in the index node to be transmitted, said paths being relative in relation to a previously transmitted path of the parent node or in relation to a previously transmitted path of the index node currently to be transmitted.

The insertion of relative paths into the bit stream is illustrated in FIG. 5. In this case the notation "." signifies a step back in the path to which the relative path refers. In node K1, the relative path "..E" in relation to the preceding entry ACB is transmitted for the entry "AE". In the child nodes K1, K2 and K3, the relative paths in relation to the first path of the respective child node are transmitted in each case in the second and third entries.

Figure 6:
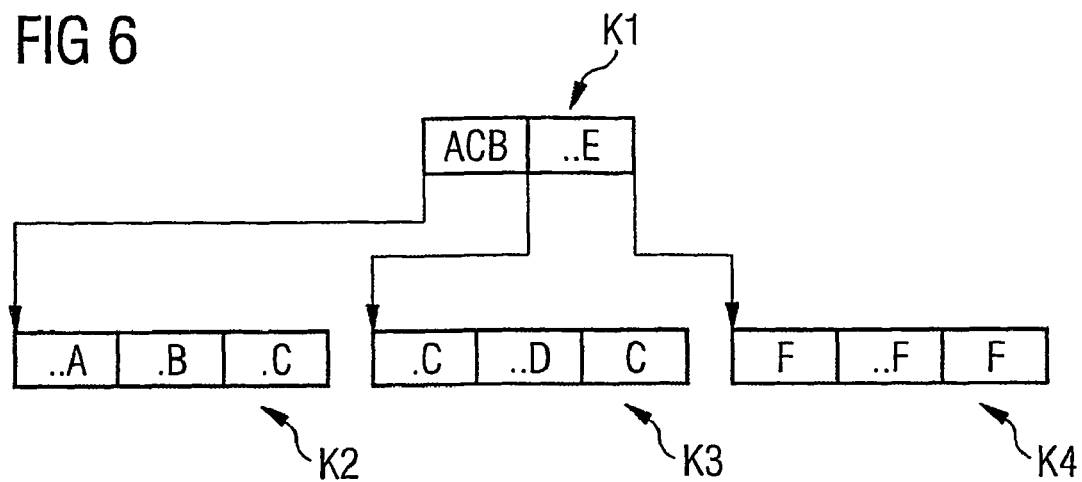
FIG. 6 illustrates the indexing tree of FIG. 4, with all the paths of the second hierarchy level being represented as relative paths.
Figure 7:
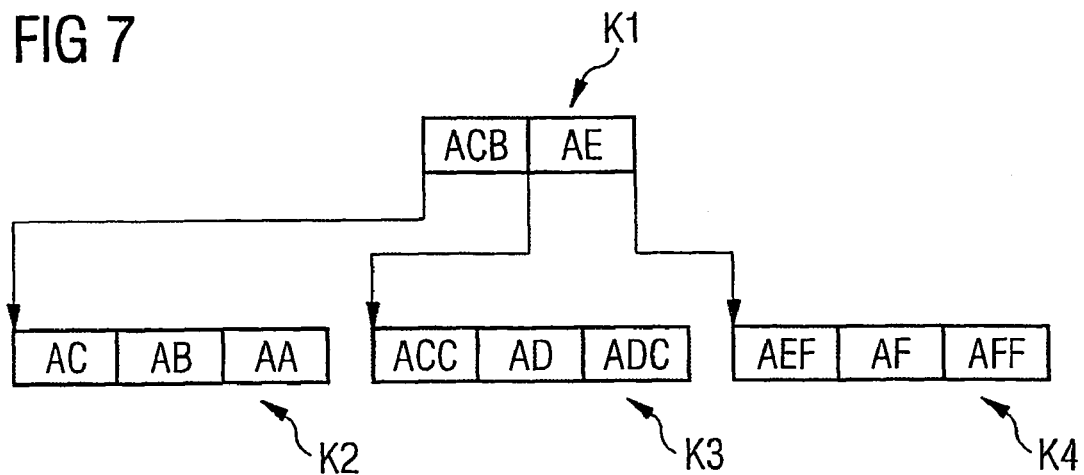
FIG. 7 illustrates a variation of the indexing tree according to FIG. 4.

Under the embodiment of FIG. 5, the full absolute path is transmitted for the first paths AA, ACC and AEF of the child nodes K2, K3 and K4 respectively. It is also possible also to transmit the first paths of the child nodes as relative paths in relation to a path of the parent node K1. This is shown in FIG. 6. In this case, instead of the paths AA and ACC of the first and second child nodes, the relative paths "..A" and ".C" in relation to the first path of the parent node are transmitted. Instead of the path "AEF" of the third child node, the relative path "F" in relation to the second path of the parent node is transmitted. In this case the paths are preferably stored in the bit stream in their byte representation.

As a result of the use of relative paths the data volume in the stream is substantially reduced because commonalities in the paths are made use of when the paths are stored, with the result that less memory space is required. In particular, with relative paths the respective common components of the paths only have to be transmitted once.

In a further embodiment, a data saving is achieved in that in the arrangement of the entries of the index nodes for the first child node K2 a reverse sequence is used compared to FIG. 4. The result of this is that the entry which has the greatest similarity to the preceding parent node K1 is located at the start of the child node K2. Thus, with special embodiments of the indexing tree this can lead to substantially shortened relative paths and a reduced memory requirement.

The paths can be the already mentioned XPATH paths of an XML description tree. Furthermore the paths can be binary coded, by means of an MPEG7 coding method for example. In particular, the binary coding methods specified in the already mentioned reference [3] can be employed. Compared with textual representations, the use of binary coded paths can lead to savings in the number of bits to be transmitted.

The above described description and drawings are only to be considered illustrative of exemplary embodiments, which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

REFERENCES

[1] http://dxl.hrz.uni-dortmund.de:8001/doc1/hrz/sqlref/sqloracle.html
[2] http://www.w3.org/TR/xpath
[3] ISO/IEC 15938-1 Multimedia Content Description Interface—Part 1: Systems, geneva 2002
[4] TV-Anytime Specification Series S-3 on Metadata, Part B, Version 13
[5] http://www.public.asu.edu/~peterjn/btree/
[6] http://www.generation5.org/simple_search.shtml

The invention claimed is:

1. A computer-implemented method for generating a bit stream comprising:
providing an indexing tree including a plurality of hierarchy levels, wherein each hierarchy level is assigned one or more index nodes, and wherein the index nodes contain index data that is sorted in the indexing tree according to one or more predetermined criteria;
designating an index node as a parent node;
designating other index nodes as child nodes, wherein at least one child node branches from the parent node and wherein the at least one child node is located in a lower hierarchy level;
inserting and sorting index data of the index nodes into the bit stream, wherein following insertion of the index data of the parent node, the index data of the at least one childe node is offset by one node following the parent node in the indexing tree on account of the sorting and is inserted without information indicating at which position the index data of said at least one child node is located in the bit stream; and
inserting information into the bit stream in each case for the a child node that is not offset by the one node following the parent node, said information indicating at which position in the bit stream the index data of said child node is located.

2. The method according to claim 1, wherein the indexing tree is a Balanced tree.

3. The method according to claim 2, wherein the index data is sorted lexicographically in the indexing tree.

4. The method according to claim 1, wherein the index data is inserted into the bit stream according to the depth-first ordering principle.

5. The method according to claim 1, wherein the index data comprises paths of a document structure tree consisting of at least one root node and a plurality of leaf nodes.

6. The method according to claim 5, wherein the index data contains the value instances of the paths and the positions of the value instances in the document which is represented by the document structure tree.

7. The method according to claim 5, wherein the index data comprises the number of paths in an index node.

8. The method according to claim 5, wherein the paths comprise absolute paths which start from the root node and lead to a leaf node.

9. The method according to claim 5, wherein the paths comprise relative paths, a relative path of a respective index node being a path relative to another path, previously inserted into the bit stream, of the index node or of an index node of a hierarchy level above the hierarchy level of the respective index node.

10. The method according to claim 9, wherein the paths inserted into the bit stream are the paths of the index node whose index data is inserted into the bit stream as the first index data of a hierarchy level in a reverse sequence to the sequence in which the index data is arranged in the index node.

11. The method according to claim 5, wherein the paths comprise description elements of an XML (Extensible Markup Language) document.

12. The method according to claim 11, wherein the paths are XPATH paths of the XML document.

13. The method according to claim 1, wherein the index data is coded in binary by means of a coding method, in particular by means of an MPEG coding method.

* * * * *